United States Patent [19]

Moricz et al.

[11] Patent Number: 5,892,687
[45] Date of Patent: Apr. 6, 1999

[54] DON'T_CARE LOGIC

[75] Inventors: Michael Moricz, Sunnyvale; Hong Li, Fremont; Johnson Limqueco, Sunnyvale, all of Calif.

[73] Assignee: Ambit Design Systems, Inc., Santa Clara, Calif.

[21] Appl. No.: 815,683

[22] Filed: Mar. 12, 1997

[51] Int. Cl.$^6$ .................................................. G06F 17/50
[52] U.S. Cl. ........................... 364/490; 364/489; 364/578
[58] Field of Search .................................... 364/480–491, 364/578; 395/500

[56] References Cited

U.S. PATENT DOCUMENTS

| | | | |
|---|---|---|---|
| 5,461,574 | 10/1995 | Matsunaga et al. | 364/489 |
| 5,499,191 | 3/1996 | Young | 364/489 |
| 5,530,841 | 6/1996 | Gregory et al. | 395/500 |
| 5,649,165 | 7/1997 | Jain et al. | 395/500 |

OTHER PUBLICATIONS

Richard C. Dorf, Editor–in–Chief: The Electrical Engineering Handbook, CRC Press, 1993, pp. 590–602, 1695–1721.

Damiani et al. ("Don't care set specifications in combinational and synchronous logic circuits", IEEE Transactions on Computer–Aided Design of Integrated Circuits and Systems, vol. 12, No. 3, pp. 365–388, Mar. 1993).

Devadas et al. ("Redundancies and don't cares in sequential logic synthesis", Proceedings of the 1989 International Test Conference: Meetings the Tests of Time, pp. 491–500, 29 Aug. 1989).

Damiani ("Nondeterministic finite–state machines and sequential don't cares", Proceedings of European Design and Test Conference, pp. 192–198, 28 Feb. 1994).

Damiani et al. ("The role of don't cares conditions in synchronous logic optimization", VLSI Logic Synthesis and Design, pp. 55–62, Jan. 1, 1991).

*Primary Examiner*—Kevin J. Teska
*Assistant Examiner*—Phallaka Kik
*Attorney, Agent, or Firm*—Michael A. Glenn

[57] ABSTRACT

A form of symbolic logic gate, referred to as don't_care logic, provides a construct that does not have a technology primitive correspondent, and that is useful for carrying valuable additional information to logic synthesis and/or logic optimization processes. Thus, a logic optimization process may proceed more effectively when presented with such don't_care information because, e.g. overlapping combinational logic is simplified (but not always eliminated) and dependency (i.e. shared combinational logic) is resolved between the data input and the enable input. The don't_care gate is readily generalized, such that it can be applied for any technology primitives that have an enable line input, where there is potential shared combinational logic between the data input (or any inputs) and the enable input. Such category may include technology primitives, such as a latch, a D_flip_flop, and a tri-state element.

20 Claims, 4 Drawing Sheets

DON'T_CARE LOGIC

BACKGROUND OF THE INVENTION

1. Technical field

The invention relates to combinational logic. More particularly, the invention relates to overlapping logic for data and enable inputs to a logic function.

2. Description of the Prior Art

Application specific integrated circuit (ASIC) is a designation applied to a variety of devices fabricated in a variety of semiconductor technologies. An ASIC is designed to perform a specific function. The major advantages of ASICs are typically lower unit cost and higher performance. This is the result of eliminating circuitry from the chip otherwise needed to make it programmable and incorporating only the logic functions that are needed for the application. This makes a smaller, less costly chip. Higher performance is a result of directly implementing the logic instead of using an instruction set that requires multiples of clock cycles to execute, as with a microprocessor.

ASICs can be divided into two categories: standard and custom. Standard ASICs are generally commodity items which have been designed by a semiconductor manufacturer and which are sold in large volumes. Custom ASICs are generally designed by or for a specific customer and are not available to the public. This allows the developer of a custom ASIC to exploit the advantages of the device. One disadvantage of custom ASICs is the high nonrecurring engineering cost associated with designing the ASIC.

ASICs are typically designed using a schematic entry design system which includes a library of cells that are usable by a target silicon foundry and technical data relating to cell performance that must be programmed into a schematic capture tool.

A block diagram of the desired ASIC is first created by the system designer. The design is implemented by placing logical elements from the library onto the screen of a workstation. The elements of the design are uniquely defined by an instance number, connections are drawn in, and the wires are named. The operator then runs the schematic entry program to produce a netlist. In producing the netlist, all of the positional information contained in the schematic drawing, i.e. what elements goes next to what and where the critical signal paths are, is lost. Because the netlist is produced from a schematic, there is no actual information regarding such factors as, for example stray capacitance, inductive coupling, or transmission line length. These parameters must be estimated and added to the netlist in a format that is usable by a timing simulator.

In addition to the netlist obtained from the schematic entry program, test vectors must be generated to simulate the netlist. To bridge the interface between the schematic entry program and the simulator program, the test vectors must be in a format required by the simulator. The simulator program itself must be programmed to handle all of the logic elements contained in the foundry library.

When the simulation is completed, the results must be examined. This requires a program that takes the output of the simulator and displays it in the format desired.

The next interface is that between the schematic entry program and the auto-place-and-route program. The router must be programmed with the appropriate standard cell library and the output from the schematic entry tool must be in a format acceptable to the router.

The router outputs the geometrical data that define the structures and locations of the structures used in the fabrication of the design in silicon. These structures define data paths and capacitive loading which may be critical to the performance of the circuit. Because the router may not produce performance that meets the design specification, it is necessary to run an extraction program on the output of the router. The extraction program traces the layout and constructs a netlist of the actual layout. The extractor can also calculate the actual node loading.

The extractor must be programmed with appropriate data relating to the electrical properties of the various structural layers. The extractor also must assure that the output format of the router is usable by the input to the extractor, and that the output of the extractor is usable by the input to the timing simulator. The netlist containing the actual loading obtained by extraction from the layout is referred to as back-annotated data. The timing simulation obtained from simulating the back-annotated netlist should represent the actual circuit performance. Otherwise, engineering (i.e. human) intervention is required.

The actual netlist, i.e. the netlist provided by the extractor, and the netlist provided by the schematic entry, i.e. the intended netlist, must be compared to determine if the real netlist is the same as the intended netlist. This is performed by a layout-versus-schematic program.

Many design systems are based upon the use of a Hardware Description Language, such as VHDL or Verilog, and may use a silicon compiler and synthesizer. Assuming the system is described in VHDL and partitioned, if needed, into one or more ASICs, the resulting VHDL description must be converted to a detailed specification. The specification is typically dependent upon the design system that is used to implement the design. For example, a synthesizer program that is used to synthesize the ASIC from the VHDL description must be expanded to include specified timing. To determine if the specification is correct, the VHDL description must be simulated. Thus, test vectors described in the required stimulus format for a VHDL simulator must be provided. Once the specification is determined to be correct, a synthesizer program which contains a library of cells and a set of design rules appropriate for the target silicon foundry is run.

The HDL design tools ideally should allow the user to describe only the desired operation of the logic circuit, i.e. the signals generated by the logic circuit. However, HDL only permits an operational description of simple circuit elements. Accordingly, only designers that have knowledge of both the use and operation of logic elements and the operational features of the desired logic circuit can successfully use HDL.

B. Gregory, R. Segal, Method For Converting A Hardware Independent User Description Of A Logic Circuit Into Hardware Components, U.S. Pat. No. 5,530,841 (25 Jun. 1996) describe the generation of a logic network using a hardware independent description technique. A hardware generator is used to synthesize the logic network based upon information provided by an assignment condition generator.

In general, during the synthesis of latch logic using such systems, enable and data logic, i.e. combinational logic, overlap. It would be advantageous to simplify the overlapping logic for data and enable inputs, and thereby simplify the design. Additionally, such overlapping logic can cause timing problems after technology mapping because the same signal, i.e. the shared signal, may arrive to the data input of the latch at a different time than to the enable input of the latch. It would therefore also be advantageous to optimize circuit design in such way as to minimize or eliminate timing issues related to enable and data logic overlap.

SUMMARY OF THE INVENTION

The invention provides a form of symbolic logic gate, referred to as don't_care logic. Such logic is a construct that does not have a technology primitive correspondent. Accordingly, at the time of technology mapping, the netlist does not contain such symbolic don't_care gates. However, don't_care logic, as defined herein, is useful for carrying valuable additional information to logic synthesis and/or logic optimization processes. Thus, a logic optimization process may proceed more effectively when presented with such don't_care information because, e.g. overlapping combinational logic is simplified (but not always eliminated) and dependency (i.e. shared combinational logic) is resolved between the data input and the enable input.

The invention herein may also be generalized, such that the don't_care gate can be applied for technology primitives that have an enable line input, where there is potential shared combinational logic between the data input (or any inputs) and the enable input. Such category may include technology primitives, such as a latch, a D_flip_flop, and a tri-state element.

DETAILED DESCRIPTION OF THE INVENTION

The invention provides a form of symbolic logic gate, referred to as don't_care logic. Such logic is a construct that does not have a technology primitive correspondent. Accordingly, at the time of technology mapping, the netlist does not contain such symbolic don't_care gates. However, don't_care logic, as defined herein, is useful for carrying valuable additional information to logic synthesis and/or logic optimization processes. Thus, a logic optimization process may proceed more effectively when presented with such don't_care information because, e.g. overlapping combinational logic is simplified (but not always eliminated) and dependency (i.e. shared combinational logic) is resolved between the data input and the enable input.

It is known that the hardware description functions generated during design synthesis and simulation using modern ASIC design systems may include a don't_care function. See, for example B. Gregory, R. Segal, Method For Converting A Hardware Independent User Description Of A Logic Circuit Into Hardware Components, U.S. Pat. No. 5,530,841 (25 Jun. 1996), which describes an assignment condition that is generated for the don't_care function when the user assigns a value of don't_care to a variable. In this system, a hardware generator uses the don't_care function assignment to Boolean minimize the logic circuit that is created. As discussed above, the herein disclosed invention is the first use of a don't_care function to address the issue of enable and data logic overlap.

Figure 1:
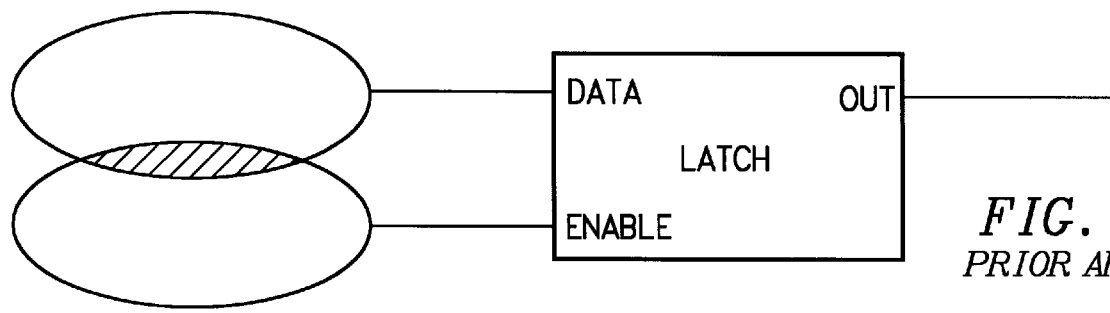
FIG. 1 is a block schematic diagram of a latch showing an enable and data logic overlap as is known in the prior art.

FIG. 1 is a block schematic diagram of a latch showing an enable and data logic overlap as is known in the prior art. In the figure, a latch 10 has a data input point 12 that receives a data set 13, has an enable input terminal 14 that receives an enable set 15. Data and enable overlap 17 are shown as a cross hatched region in the figure. As discussed above, it would be advantageous to simplify the overlapping logic for data and enable inputs, and thereby simplify the design. Because such overlapping logic can cause timing problems after technology mapping when the same signal, i.e. the shared signal, arrives at the data input of the latch at a different time than at the enable input of the latch. The following is an example of a simple conditional statement:

```
Module Test1 (cond, in, out);
    Input cond, in;
    Output out;
    Always @ (in or cond)
        If (cond) out=in;
Endmodule
```

Figure 2A:
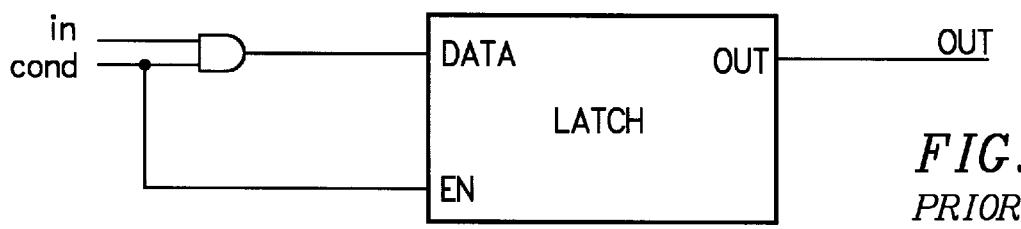
FIG. 2a is a block schematic diagram of a simple conditional logic function after allocation as is known in the prior art.

FIG. 2a is a block schematic diagram of the simple conditional logic function after allocation as is known in the prior art. In the figure, a latch 20 and an AND gate 21 are used to define the conditional logic function. The function includes an input terminal 27, a conditional terminal 28, and an output terminal 29.

Figure 2B:
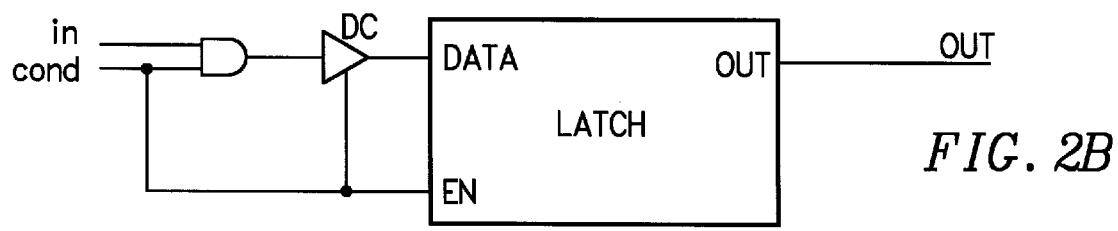
FIG. 2b is a block schematic diagram of a simple conditional logic function after allocation according to the invention.

FIG. 2b is a block schematic diagram of a simple conditional logic function after allocation according to the invention. In the figure, a latch 22 and an AND gate 24 are used to define the conditional logic function. The function includes an input terminal 27, a conditional terminal 28, and an output terminal 29. The function also includes a don't_care symbolic gate 26.

Figure 3A:
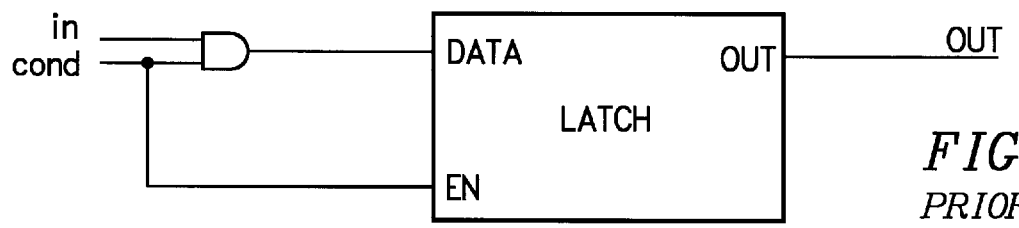
FIG. 3a is a block schematic diagram of a simple conditional logic function after logic optimization as is known in the prior art.

FIG. 3a is a block schematic diagram of the above simple conditional logic function after logic optimization as is known in the prior art. In the figure, a latch 20a and an AND gate 21a are used to define the conditional logic function. The function includes an input terminal 27, a conditional terminal 28, and an output terminal 29. As can been seen, after optimization, the function is defined at the same level of complexity as after allocation (see FIG. 2a).

Figure 3B:
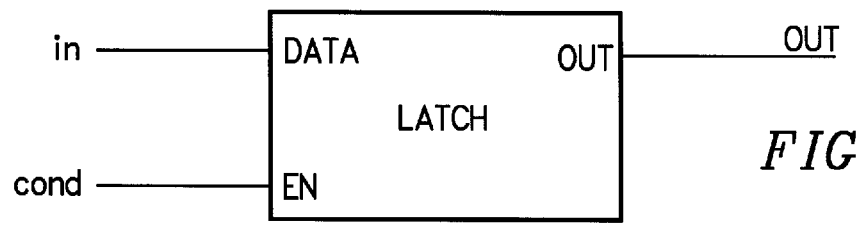
FIG. 3b is a block schematic diagram of a simple conditional logic function after logic optimization according to the invention.

FIG. 3b is a block schematic diagram of a simple conditional logic function after logic optimization according to the invention. In the figure, a latch 22a is used to define the conditional logic function. The function includes an input terminal 27, a conditional terminal 28, and an output terminal 29. The use of a don't_care symbolic gate 26 during optimization (after allocation—see FIG. 2b) results in a less complex function. It can be seen that, after optimization, the symbolic don't_care gate has been eliminated from the function.

Thus, after optimization the overlapping combinational logic, i.e. the AND gate in this example, is optimized out of the function when a symbolic don't_care gate is used. Further, there is no more dependency, i.e. overlap, between the data input and the enable inputs of the latch. Accordingly, potential timing problems, as outlined above, are eliminated after technology mapping.

Figure 4:
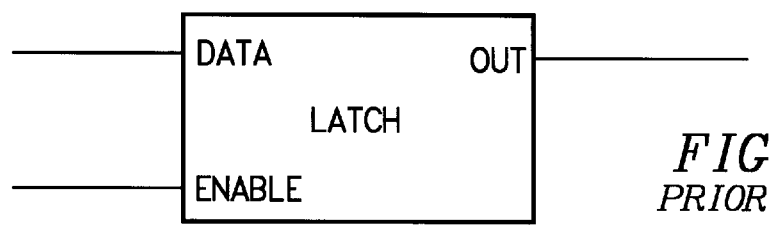
FIG. 4 is a block schematic diagram of a latch as is known in the prior art.

A latch is used for a rudimentary explanation of the applicability of such don't_care function. For example, FIG. 4 is a block schematic diagram of a latch as is known in the prior art. The latch 40 includes an input terminal 41, a conditional terminal 42, and an output terminal 43. The internal data of the latch are updated only when the enable line is set to a logic "1." Otherwise, the data are not updated. Thus, a don't_care symbolic gate (also referred to herein as a cell) can be inserted into the logic path of the latch, i.e. the latch only "cares" when the enable line is set to a logic "1."

Figure 5:
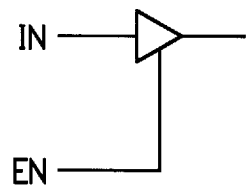
FIG. 5 is a block diagram of a don't_care symbolic cell according to the invention.

FIG. 5 is a block diagram of a don't_care symbolic cell according to the invention. The cell 50 includes an input terminal 51, a conditional terminal 52, and an output terminal 53.

The don't_care function can be described in many ways. With regard to the presently preferred embodiment of the invention, the don't_care function is described in two forms, as follows:

$$DC_{function} = (IN \text{ and } EN) \text{ or } (DON'T\_CARE \text{ and } \overline{EN}) \quad (1)$$

$$DC_{function} = (IN \text{ and } \overline{EN}) \text{ or } (DON'T\_CARE \text{ and } EN) \quad (2)$$

The following is an example of a mature incomplete conditional function:

```
Module Test2 (a, sel, out);
    Input [0:1]sel;
    Input a;
    Output out;
    Always @ (sel or a)
        Case (sel)
            2'b00 : out=1'b1;
            2'b10 : out=a;
        Endcase
Endmodule
```

Figure 6A:
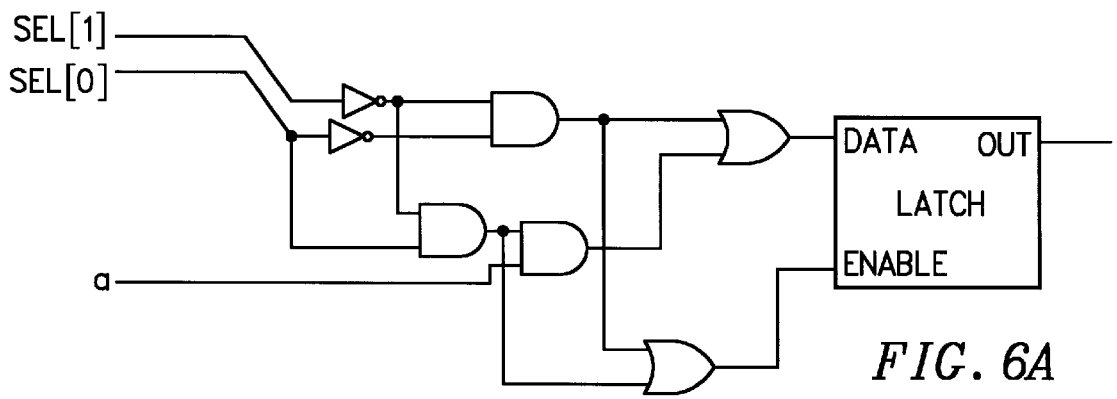
FIG. 6a is a block schematic diagram of a mature incomplete conditional logic function after allocation as is known in the prior art.

FIG. 6a is a block schematic diagram of the above mature incomplete conditional logic function after allocation. In the figure, two select lines 68 and 69 are used to condition the function via a data input 70. The select lines are coupled through inverters 66, 67 to AND gates 63, 65. The output of the AND gate 65 is ANDed with the data line a 70 and by the AND gate 64. The output of the AND gate 64 is ORed with the output of the AND gate 63 at the input of OR gate 62. The output of the AND gate 63 is also ORed with the output of the AND gate 65 at the OR gated 61. The outputs of OR gates 62 and 61 are connected to the respective DATA and ENABLE inputs of a latch 60, which includes an input terminal 72, a conditional terminal 73, and an output terminal 71.

Figure 6B:
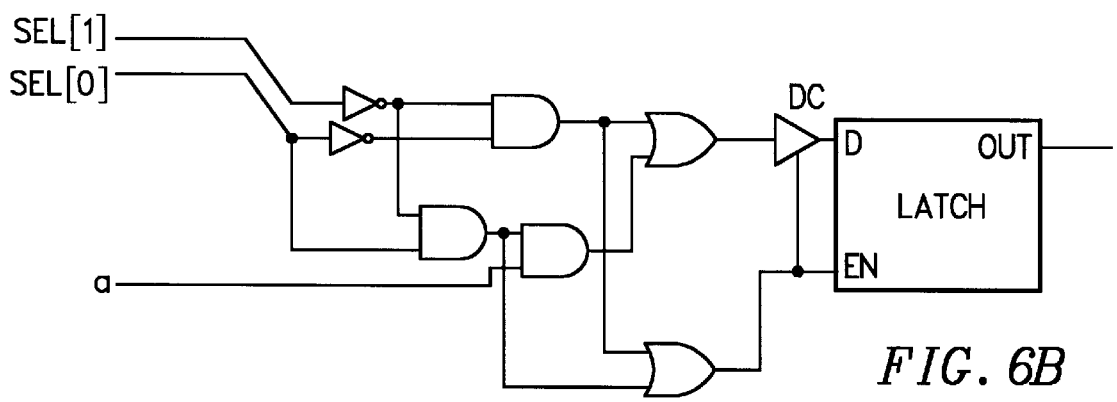
FIG. 6b is a block schematic diagram of a mature incomplete conditional logic function after allocation according to the invention.

FIG. 6b is a block schematic diagram of the above mature incomplete conditional logic function after allocation according to the invention. In the figure, two select lines 68 and 69 are used to condition the function via data input a 70. The select lines are coupled through inverters 66, 67 to AND gates 63, 65. The output of the AND gate 65 is ANDed with the data line 70 and by the AND gate 64. The output of the AND gate 64 is ORed with the output of the AND gate 63 at the input of OR gate 62. The output of the AND gate 63 is also ORed with the output of the AND gate 65 at the OR gated 61. The outputs of OR gates 62 and 61 are connected to the respective DATA and ENABLE inputs of a latch 60, which includes an input terminal 72, a conditional terminal 73, and an output terminal 71. The function also includes a don't_care symbolic gate 75 at the input of the latch 60.

Figure 7A:
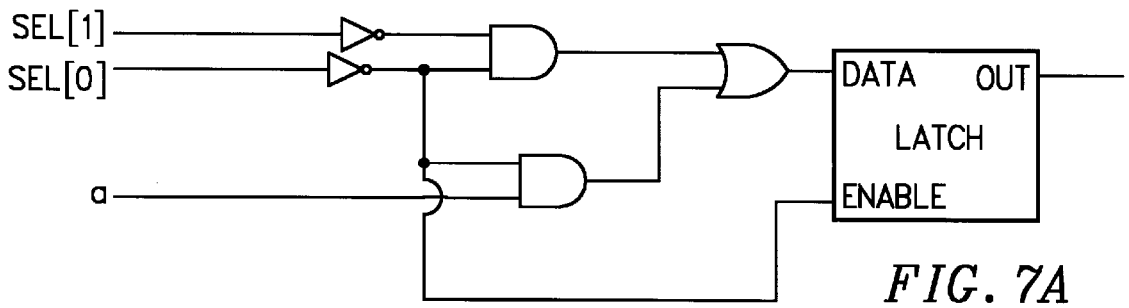
FIG. 7a is a block schematic diagram of a mature incomplete conditional logic function after logic optimization as is known in the prior art.

FIG. 7a is a block schematic diagram of the above mature incomplete conditional logic function after logic optimization as is known in the prior art. In the figure, two select lines 68 and 69 are used to condition the function via data input a 70. The select lines are coupled through inverters 66, 67 to AND gates 76, 77. The outputs of the AND gates are ORed at the input of OR gate 78. The outputs of the OR gate 78 is connected to the respective DATA and ENABLE inputs of a latch 60a, which includes an input terminal 72, a conditional terminal 73, and an output terminal 71. Thus, logic optimization has simplified the function, i.e. by replacing gates 61–65 with gates 76–78.

Figure 7B:
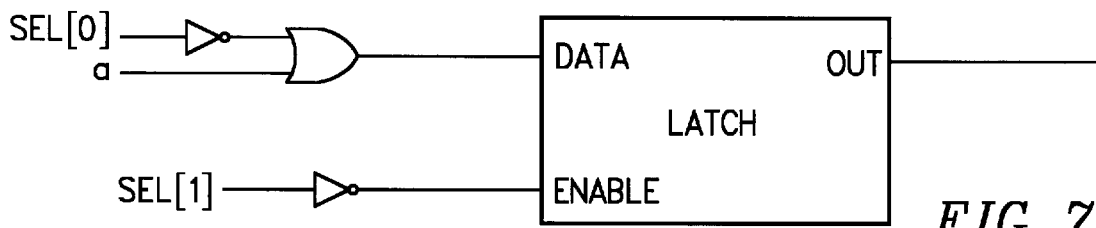
FIG. 7b is a block schematic diagram of a mature incomplete conditional logic function after logic optimization according to the invention.

FIG. 7b is a block schematic diagram of the above mature incomplete conditional logic function after logic optimization according to the invention. In the figure, two select lines 68 and 69 are used to condition the function via a data input 70. A first select line SEL[0] 68 is coupled through an inverter 79 to an OR gate 81. A second select line SEL[1] 69 is coupled through an invertor 80 to the ENABLE input of a latch 60b, which includes an input terminal 72, a conditional terminal 73, and an output terminal 71. The data input 70 is coupled to an input of the OR gate 81. The output of the OR gate 81 is coupled to the DATA input of the latch 60b. The use of a don't_care symbolic gate 75 during optimization (after allocation—see FIG. 6b) results in a less complex function. It can be seen that, after optimization, the symbolic don't_care gate has been eliminated from the function.

The foregoing example illustrates that logic optimization is more effective when presented with don't_care information. Thus, overlapping combinational logic is simplified, although not always eliminated; and dependency (i.e. shared combinational logic) is resolved between the data input and the enable input of the logic function in question.

The invention herein may also be generalized, such that the don't_care gate can be applied for technology primitives that have an enable line input, where there is potential shared combinational logic between the data input (or any inputs) and the enable input. Such category may include technology primitives that comprise a logic function having one or more general inputs; an output; and enable logic for enabling said logic function whether or not data is present at said one or more general inputs, said enable logic passing any data present at said one or more general inputs to said output during an enable state and not passing any data present at said one or more general inputs to said output during an $\overline{\text{enable}}$ state.

Figure 8:
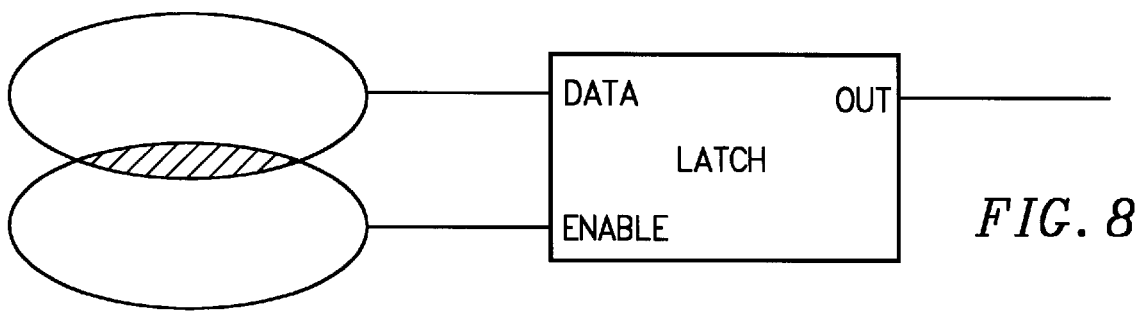
FIG. 8 is a block schematic diagram showing a technology primitive for a latch according to the prior art.
Figure 9:
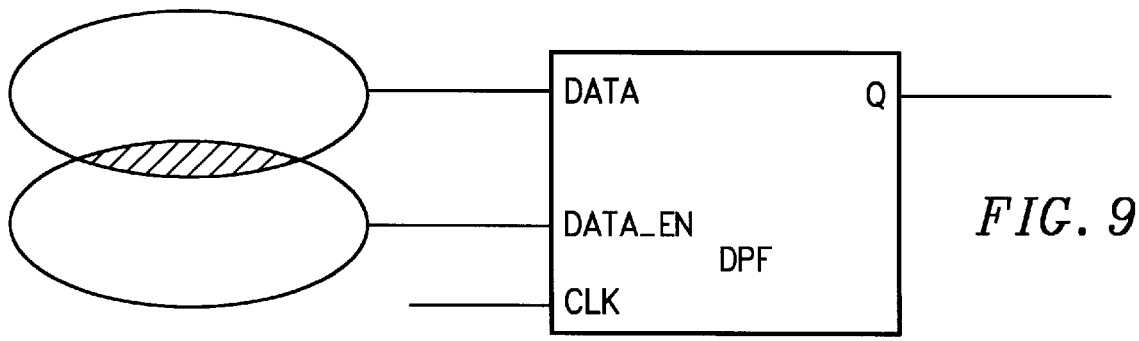
FIG. 9 is a block schematic diagram showing a technology primitive for a D_flip_flop according to the prior art.
Figure 10:
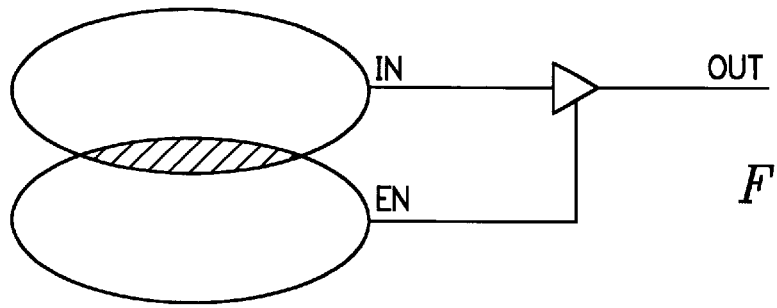
FIG. 10 is a block schematic diagram showing a technology primitive for a three-state element according to the prior art.

For example, FIG. 8 is a block schematic diagram showing a technology primitive for a latch 85 having a DATA input 86 that receives a data set 89, an ENABLE input 87 that receives an enable set 90, and an OUTPUT 89, where the overlap 91 between the data set and the enable set is indicated by cross hatching; FIG. 9 is a block schematic diagram showing a technology primitive for a D_flip_flop (DFF) 92 having a DATA input 94 that receives a data set 97, a DATA_EN input 98 that receives a data enable set 98, a clock input CLK 96, and an output Q 93, where the overlap 99 between the data set and the data enable set is indicated by cross hatching; and FIG. 10 is a block schematic diagram showing a technology primitive for a three-state element 100 having an input IN 103 that receives a data set 104, an enable input EN 102 that receives an enable set 105, and an output OUT 101, where the overlap 106 between the data set and the enable set is indicated by cross hatching.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

We claim:

1. A method for effecting logic optimization, comprising the steps of:

defining a logic function having an overlapping data input and enable input;

providing at least one symbolic don't_care logic gate that does not have a technology primitive correspondent;

carrying additional information to logic synthesis and/or logic optimization processes with said don't_care logic gate in the form of a don't_care state; and generating a netlist that does not contain such symbolic don't_care logic gate;

wherein overlapping combinational logic is simplified and dependency is resolved between said data input and said enable input of said logic function by said don't_care logic gate.

2. The method of claim 1, wherein said don't_care logic gate is defined as either one of the following or can be reduced to one of the following sum-of-products forms:

$DC_{function}$=(IN and EN) or (DON'T_CARE and $\overline{EN}$); or $DC_{function}$=(IN and $\overline{EN}$) or (DON'T_CARE and EN), where $DC_{function}$ is the don't care logic gate function, IN is the input to said logic function, and EN is enable input to said logic function.

3. The method of claim 1, further comprising the step of:

providing at least one don't_care symbolic cell that includes an input terminal, a conditional terminal, and an output terminal.

4. The method of claim 1, wherein said logic function comprises a latch that includes an input terminal, a conditional terminal, and an output terminal, wherein internal data of said latch are updated only when said enable line is set to either a logic "1" or a logic "0" and wherein said data are otherwise not updated.

5. The method of claim 1, further comprising the step of:

inserting a don't_care logic gate into a logic path of said logic function.

6. The method of claim 1, further comprising the step of:

applying don't_care logic gates to technology primitives that have an enable line input, where there is shared combinational logic between another input and said enable input.

7. The method of claim 6, wherein said technology primitives comprise a logic function having one or more general inputs; an output; and enable logic for enabling said logic function whether or not data is present at said one or more general inputs, said enable logic passing any data present at said one or more general inputs to said output during an enable state and not passing any data present at said one or more general inputs to said output during an enable state.

8. The method of claim 6, wherein said technology primitives comprise a latch having a DATA input that receives a data set, an ENABLE input that receives an enable set, and an OUTPUT, where there is an overlap between said data set and said enable set.

9. The method of claim 6, wherein said technology primitives comprise a D_flip_flop (DFF) having a DATA input that receives a data set, a DATA_EN input that receives a data enable set, a clock input CLK, and an output Q, where there is an overlap between the data set and the data enable set.

10. The method of claim 6, wherein said technology primitives comprise a three-state element having an input IN that receives a data set, an enable input EN that receives an enable set, and an output, where there is an overlap between the data set and the enable set.

11. An apparatus for effecting logic optimization, comprising:

a logic function having an overlapping data input and enable input; and at least one symbolic don't_care logic gate that does not have a technology primitive correspondent, said don't_care logic gate carrying additional information to logic synthesis and/or logic optimization processes in the form of a don't_care state;

wherein said logic synthesis and/or logic optimization processes generate a netlist that does not contain such symbolic don't_care logic gate; and wherein overlapping combinational logic is simplified and dependency is resolved between said data input and said enable input of said logic function by said don't_care logic gate.

12. The apparatus of claim 11, wherein said don't_care logic gate is defined as either one of the following, or can be reduced to one of the following sum-of-products forms:

$DC_{function}$=(IN and EN) or (DON'T_CARE and $\overline{EN}$); or $DC_{function}$=(IN and $\overline{EN}$) or (DON'T_CARE and EN), where $DC_{function}$ is the don't care logic gate function, IN is the input to said logic function, and EN is enable input to said logic function.

13. The apparatus of claim 11, further comprising:

at least one don't_care symbolic cell that includes an input terminal, a conditional terminal, and an output terminal.

14. The apparatus of claim 11, wherein said logic function comprises a latch that includes an input terminal, a conditional terminal, and an output terminal, wherein internal data of said latch are updated only when said enable line is set to either a logic "1" or a logic "0" and wherein said data are otherwise not updated.

15. The apparatus of claim 11, further comprising:

a don't_care logic gate inserted into a logic path of said logic function.

16. The apparatus of claim 11, further comprising:

at least one don't_care logic gate applied to technology primitives that have an enable line input, where there is shared combinational logic between another input and said enable input.

17. The apparatus of claim 16, wherein said technology primitives comprise a logic function having one or more general inputs; an output; and enable logic for enabling said logic function whether or not data is present at said one or more general inputs, said enable logic passing any data present at said one or more general inputs to said output during an enable state and not passing any data present at said one or more general inputs to said output during an enable state.

18. The apparatus of claim 16, wherein said technology primitives comprise:

a latch having a DATA input that receives a data set, an ENABLE input that receives an enable set, and an OUTPUT, where there is an overlap between said data set and said enable set.

19. The apparatus of claim 16, wherein said technology primitives comprise:

a D_flip_flop (DFF) having a DATA input that receives a data set, a DATA_EN input that receives a data enable set, a clock input CLK, and an output Q, where there is an overlap between the data set and the data enable set.

20. The apparatus of claim 16, wherein said technology primitives comprise:

a three-state element having an input IN that receives a data set, an enable input EN that receives an enable set, and an output, where there is an overlap between the data set and the enable set.

* * * * *